US011047930B2

(12) United States Patent
Sun et al.

(10) Patent No.: US 11,047,930 B2
(45) Date of Patent: Jun. 29, 2021

(54) HALL EFFECT SENSORS WITH TUNABLE SENSITIVITY AND/OR RESISTANCE

(71) Applicant: GLOBALFOUNDRIES Singapore Pte. Ltd., Singapore (SG)

(72) Inventors: Yongshun Sun, Singapore (SG); Eng Huat Toh, Singapore (SG); Kiok Boone Elgin Quek, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 0 days.

(21) Appl. No.: 16/297,880

(22) Filed: Mar. 11, 2019

(65) Prior Publication Data
US 2020/0292631 A1  Sep. 17, 2020

(51) Int. Cl.
*H01L 43/06* (2006.01)
*G01R 33/00* (2006.01)
(Continued)

(52) U.S. Cl.
CPC ......... *G01R 33/0023* (2013.01); *G01R 33/07* (2013.01); *H01L 27/22* (2013.01);
(Continued)

(58) Field of Classification Search
CPC .............. G01R 33/0023; G01R 15/202; G01R 33/07–077; H01L 43/065; H01L 43/14;
(Continued)

(56) References Cited

U.S. PATENT DOCUMENTS

| 4,660,065 A * | 4/1987 | Carvajal | H01L 43/065 |
| | | | 257/426 |
| 4,929,993 A * | 5/1990 | Popovic | H01L 43/065 |
| | | | 257/424 |

(Continued)

OTHER PUBLICATIONS

Lee et al., "0.13 μm modular BCD technology enable to embedding high density E2PROM, RF and hall sensor suitable for IoT application", 2016 28th International Symposium on Power Semiconductor Devices and ICs (ISPSD), Jun. 2016, pp. 419-422, IEEE.
(Continued)

*Primary Examiner* — Mohammad M Hoque
(74) *Attorney, Agent, or Firm* — Viering Jentschura & Partner mbB (57) ABSTRACT

A device having a Hall effect sensor is provided. The Hall effect sensor includes a sensor well and a Hall plate disposed within the sensor well. The Hall plate includes a first current terminal and a second current terminal configured to flow a current through the Hall plate, and the Hall plate further includes a first sensing terminal and a second sensing terminal configured to sense a Hall voltage. A separation layer and a separation well are disposed within the sensor well, as well as surround the Hall plate and isolate the Hall plate. At least one of a current sensitivity and a resistance of the Hall effect sensor is tunable based on an adjustable thickness of the Hall plate. The thickness of the Hall plate is adjustable based at least in part on implants in the separation layer and/or a bias voltage applied to the separation layer.

20 Claims, 5 Drawing Sheets

(51) Int. Cl.
*H01L 43/14* (2006.01)
*H01L 27/22* (2006.01)
*G01R 33/07* (2006.01)
*H01L 43/04* (2006.01)

(52) U.S. Cl.
CPC ............ *H01L 43/065* (2013.01); *H01L 43/14* (2013.01); *H01L 43/04* (2013.01)

(58) Field of Classification Search
CPC . H01L 27/22; H01L 43/04; H01L 43/06–065; H03B 15/00–006
USPC ........................................................ 257/427
See application file for complete search history.

(56) References Cited

U.S. PATENT DOCUMENTS

| | | | | |
|---|---|---|---|---|
| 7,626,377 | B2* | 12/2009 | Kilian | G01R 33/07 324/117 H |
| 9,484,525 | B2* | 11/2016 | Ausserlechner | H01L 43/04 |
| 2009/0295375 | A1* | 12/2009 | Oohira | G01D 5/145 324/207.21 |
| 2013/0342194 | A1* | 12/2013 | Motz | G01R 33/077 324/251 |
| 2014/0070795 | A1* | 3/2014 | Kolb | G01R 33/0052 324/202 |
| 2014/0183662 | A1* | 7/2014 | Zhang | H01L 21/823493 257/401 |
| 2015/0255709 | A1* | 9/2015 | Hebert | H01L 43/065 257/427 |
| 2016/0003923 | A1* | 1/2016 | Zieren | H01L 43/08 324/252 |
| 2016/0079344 | A1* | 3/2016 | Agam | H01L 29/0619 257/493 |
| 2016/0268498 | A1* | 9/2016 | Eckinger | G01R 33/0052 |
| 2017/0288131 | A1* | 10/2017 | Sun | G01R 33/0052 |
| 2018/0031644 | A1* | 2/2018 | Ausserlechner | G01R 33/0029 |
| 2018/0198061 | A1* | 7/2018 | Toh | H01L 43/04 |

OTHER PUBLICATIONS

Mellet et al., "A novel CMOS Hall effect sensor", Sensors and Actuators A: Physical, May 2014, 18 pages, vol. 211.

Paun et al., "Hall Effect Sensors Design, Integration and Behavior Analysis", Journal of Sensor and Actuator Networks, 2013, pp. 85-97, 2, ISSN 2224-2708.

Hosseini et al., "Introducing a High Sensitive Hall Effect Sensor", World Academy of Science, Engineering and Technology, International Science Index, 2008, pp. 396-399, vol. 2, No. 3.

Liu et al., "Low-Power and High-Sensitivity System-on-Chip Hall Effect Sensor", 2017 IEEE Sensors, 2017, 3 pages, IEEE.

* cited by examiner

HALL EFFECT SENSORS WITH TUNABLE SENSITIVITY AND/OR RESISTANCE

TECHNICAL FIELD

The present disclosure relates generally to semiconductor devices, and more particularly to Hall effect sensors.

BACKGROUND

Hall Effect sensors or devices, which are capable of measuring small changes in magnetic field, have a broad range of applications, including consumer electronics (CE), automotive, and security. In order to guarantee optimal behavior of the Hall Effect sensors, high sensitivity, low offset, and low temperature drift are amongst performance aspects that need to be achieved. In various applications, the Hall devices have different resistance, voltage sensitivity and current sensitivity requirements in order to perform the desired sensing for the different applications. Optimization of the various conflicting parameters are difficult to achieve within the same device structure.

From the foregoing discussion, it is desirable to provide Hall effect sensors with highly tunable parameters including resistance, voltage sensitivity, and current sensitivity within the same Hall device structure.

SUMMARY

Embodiments generally relate to semiconductor devices and method for forming the semiconductor devices. In some embodiments, a device having a sensor region over a substrate is provided. A Hall effect sensor is disposed in the sensor region. The Hall effect sensor includes a sensor well and a Hall plate disposed within the sensor well. The Hall plate includes a first current terminal and a second current terminal configured to flow a current through the Hall plate, and a first sensing terminal and a second sensing terminal configured to sense a Hall voltage are also included in the Hall plate. A separation layer and a separation well are disposed within the sensor well. The separation well includes separation well terminals coupled to a separation layer bias voltage for biasing the separation layer. The separation layer and the separation well surround the Hall plate and isolate the Hall plate from the sensor well. At least one of a current sensitivity and a resistance of the Hall effect sensor is tunable based on an adjustable thickness of the Hall plate. The thickness of the Hall plate is adjustable based at least in part on implants in the separation layer and/or a bias voltage applied to the separation layer.

In some embodiments, a method for forming a device is provided. The method includes providing a substrate having a sensor region over the substrate. A Hall effect sensor may be formed in the sensor region. Forming the Hall effect sensor includes forming a sensor well and a Hall plate within the sensor well. The Hall plate includes the first and second current terminals configured to flow a current through the Hall plate, and the first and second sensing terminals configured to sense a Hall voltage. A separation layer and a separation well are formed within the sensor well. The separation well includes separation well terminals coupled to a separation layer bias voltage for biasing the separation layer. The separation layer and the separation well surround the Hall plate and isolate the Hall plate from the sensor well. At least one of a current sensitivity and a resistance of the Hall effect sensor is tunable based on an adjustable thickness of the Hall plate. The thickness of the Hall plate is adjustable based at least in part on implants in the separation layer and/or a bias voltage applied to the separation layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic, or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to semiconductor devices or integrated circuits (ICs). More particularly, embodiments relate to ICs with embedded Hall devices or sensors. The devices or ICs can be incorporated into or used with various products, such as automobiles and consumer electronic products.

Figure 1A:
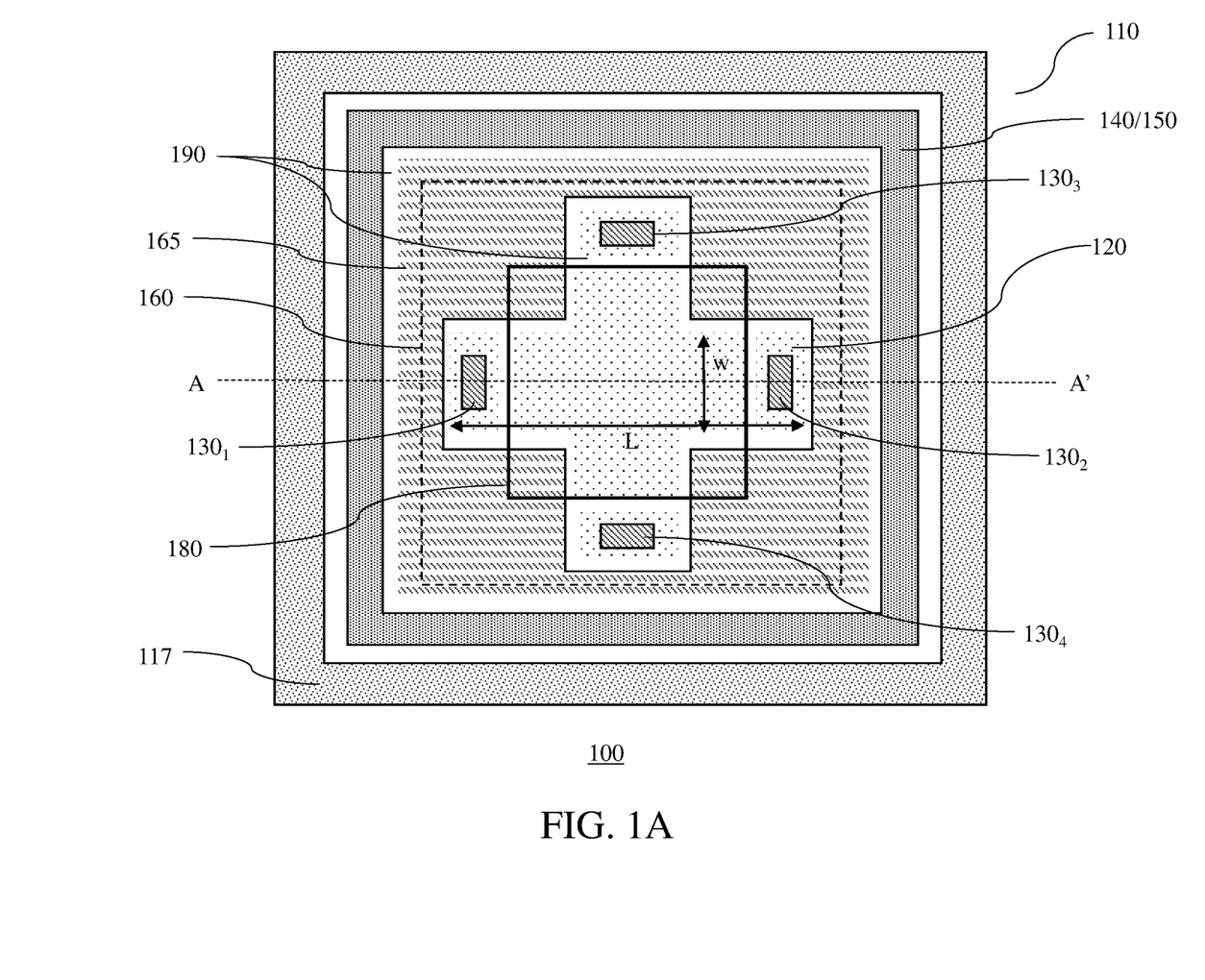
FIG. 1A shows a simplified top view of an embodiment of a device.
Figure 1B:
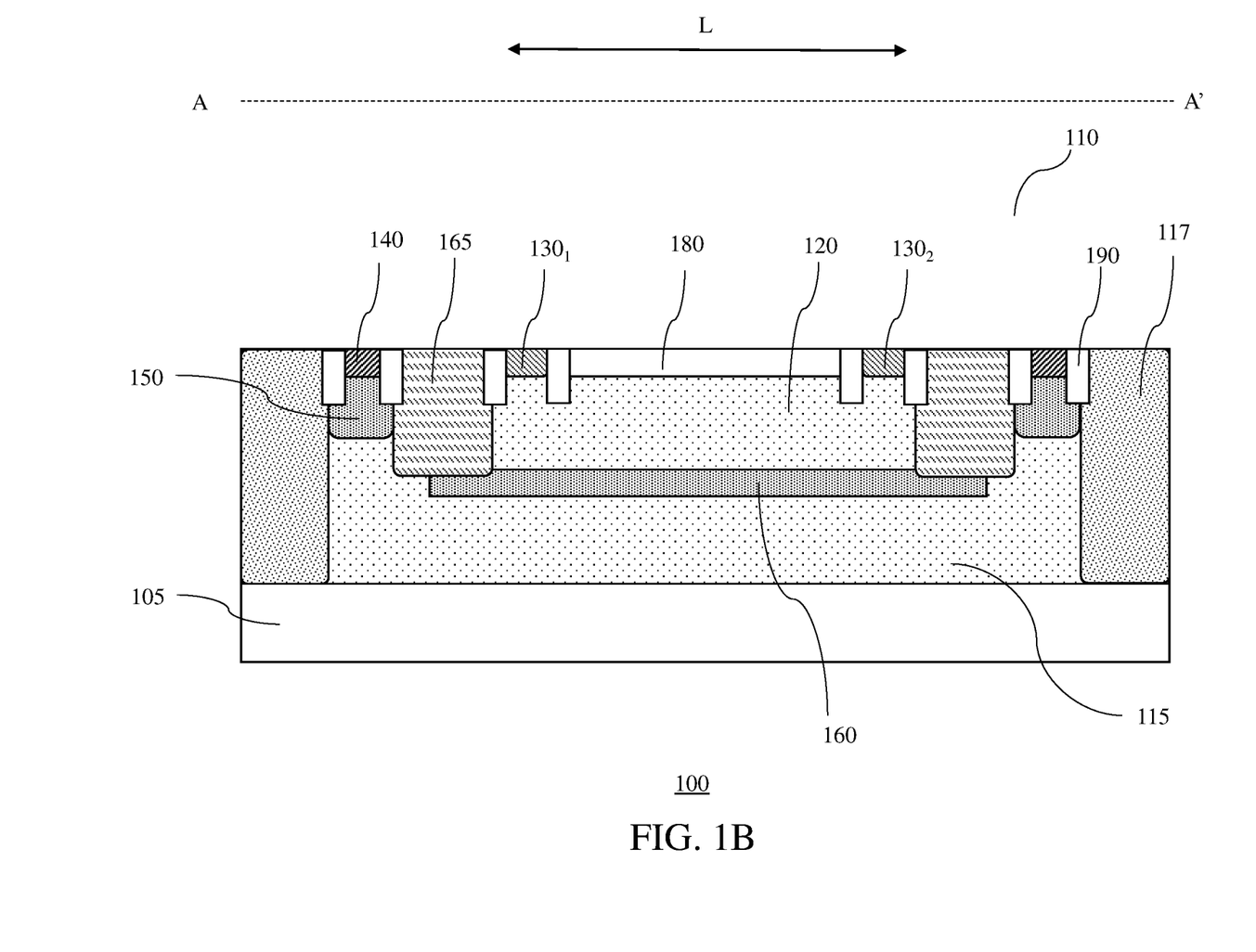
FIG. 1B shows a simplified cross-sectional view of the device.

FIG. 1A shows a simplified top view of an embodiment of a device 100, while FIG. 1B shows a simplified cross-sectional view of the device 100. The device 100 may be an IC embedded with one or more Hall effect sensors. Other types of devices may also be useful. The device may be formed in parallel on a wafer and subsequently be singulated. The device includes a substrate 105. The substrate may be a part of the wafer. In a non-limiting embodiment, the substrate 105 may be a bulk substrate. The substrate 105 may be a semiconductor substrate, such as a silicon substrate in a non-limiting embodiment. For example, the substrate may be a lightly doped p-type substrate in a non-limiting embodiment. Providing an intrinsic or other type of doped substrates, such as silicon-germanium (SiGe), germanium (Ge), gallium-arsenic (GaAs), or any other suitable semiconductor materials, may also be useful. In other embodiments, the substrate may be a crystalline-on-insulator (COI) substrate, such as a silicon-on-insulator (SOI) substrate. A COI substrate may include a surface crystalline layer separated from a bulk crystalline by an insulator layer. The insulator layer, for example, may be formed of a dielectric insulating material. The insulator layer, for example, may be formed from silicon oxide, which provides a buried oxide (BOX) layer. Other types of substrates may also be useful.

The device may include doped regions having different dopant concentrations. For example, the device may include heavily doped ($x^+$), intermediately doped (x) and lightly doped ($x^-$) regions, where x is the polarity type which can be P or N. In a non-limiting embodiment, a lightly doped region may have a dopant concentration of about $1E15/cm^3$ to about $1E16/cm^3$; an intermediately doped region may have a dopant concentration of about $1E17/cm^3$ to about $1E18/cm^3$; and a heavily doped region may have a dopant concentration of about $1E19/cm^3$ to about $1E20/cm^3$. Providing other dopant concentrations for different doped regions may also be useful. In a non-limiting example, P-type dopants may include boron (B), aluminum (Al), indium (In), or a combination thereof, while N-type dopants may include phosphorous (P), arsenic (As), antimony (Sb), or a combination thereof.

The substrate may include a sensor region. One or more Hall effect sensors (or Hall sensors or Hall devices) may be disposed in the sensor region. In a non-limiting embodiment, a Hall effect sensor 110 is disposed in the sensor region. Other types of components or device regions for the device 100 may also be useful. The Hall effect sensor 110 includes a sensor well 115. In a non-limiting embodiment, the sensor well 115 may be an epitaxial layer disposed over the substrate. For example, the epitaxial layer may be grown over the substrate 105. In another non-limiting embodiment, the sensor well may be a deep doped well disposed in the substrate 105. Other types of sensor wells may also be useful. The sensor well may be doped with sensor well dopants. In a non-limiting embodiment, the sensor well 115 may be doped with first polarity type dopants for a first polarity type sensor. In a non-limiting embodiment, the first polarity type dopants may be N-type dopants. For example, the sensor well 115 may be doped with N-type dopants for an N-type Hall sensor. Providing an N-type sensor well for the Hall effect sensor enables higher carrier mobility in a Hall plate 120, as will be described. The sensor well 115 may be lightly doped with the first polarity type dopants. Providing a lightly doped sensor well 115 may enable higher carrier mobility in the Hall plate 120 due to the low doping concentration. The low doping concentration and high carrier mobility in the Hall plate 120 enables high voltage sensitivity to be achieved in the Hall effect sensor. Providing the sensor well 115 with other types of dopants, such as P-type dopants, or other dopant concentrations may also be useful.

In other embodiments, the sensor well 115 may be a high voltage well (HV well) for a HV device. The HV well may be doped with sensor well dopants. For instance, when doped with N-type dopants or P-type dopants, the HV well may be a HVN well or a HVP well, respectively. In some embodiments, the HV well may be formed within a deep doped well (e.g., deep N-type well) in the substrate 105 where the deep doped well is used for device isolation (e.g., for HV device isolation).

In a non-limiting embodiment, a sensor region isolation 117 may be arranged over the substrate. The sensor region isolation 117 may be arranged to surround the sensor region. The sensor region isolation 117 isolates the sensor region from other device regions in the substrate. For example, the sensor region isolation 117 isolates the Hall devices from logic devices. In a non-limiting embodiment, the sensor region isolation 117 may be arranged to surround the sensor well 115. In a non-limiting embodiment, the sensor region isolation 117 isolates the sensor well 115 from one or more adjacent sensor wells (not shown). For example, each Hall effect sensor may be provided with its individual isolated sensor well 115, enabling multiple Hall effect sensors to be operated separately with different biasing voltages to the respective sensor wells. In other embodiments, multiple Hall effect sensors may be provided within a single sensor region isolation 117. In the case where multiple Hall effect sensors are provided within a single sensor region isolation 117, a biasing voltage to the sensor well will apply to all the Hall effect sensors as they share the same sensor well 115. The sensor region isolation 117 may have a ring configuration surrounding the sensor well, in a non-limiting example.

As illustrated in FIG. 1B, the sensor region isolation 117 may have a same depth as the sensor well 115. Providing a sensor region isolation having other depths, such as extending from a top surface of the sensor well and beyond a bottom surface of the sensor well, may also be useful. The sensor region isolation 117 may be doped with dopants of the opposite polarity type to the sensor well 115. For example, the sensor region isolation 117 may be doped with second polarity type dopants in the case the sensor well 115 is doped with first polarity type dopants. In a non-limiting embodiment, the sensor region isolation 117 may be doped with P-type dopants in the case the sensor well is doped with N-type dopants. Alternatively, the sensor region isolation 117 may be doped with N-type dopants in the case the sensor well is doped with P-type dopants. The sensor region isolation 117 may be lightly or intermediately doped with dopants.

The Hall effect sensor 110 includes the Hall plate 120 disposed within the sensor well 115. In a non-limiting embodiment, the Hall plate has a cross shape or footprint, as illustrated in FIG. 1A. The cross-sectional view is along A-A' of the top view. In a non-limiting embodiment, the cross-sectional view is along the length direction of the Hall plate. In the case of the cross shape, the Hall plate includes four segments arranged in a cross configuration, with a central portion which serves as an intersection. The segments may be symmetrical, in non-limiting example. For example, the segments may have the same dimensions, such as width, length, and a predefined thickness. The predefined thickness of the Hall plate may be based on a separation layer formed within the sensor well, as will be described. Providing a Hall plate with non-symmetrical segments may also be useful. In other embodiments, the Hall plate may have other shapes or configurations.

In a non-limiting embodiment, the Hall plate 120 may be formed of the same material and dopants as the sensor well 115. For example, in the case the sensor well 115 is formed of an epitaxial layer grown over the substrate 105, the Hall plate may be formed of the same epitaxial layer. In the case the sensor well is a deep doped well in the substrate 105, similarly, the Hall plate may be formed from the deep doped well in the substrate (i.e., part of the deep doped well). The Hall plate may include Hall plate dopants. The Hall plate dopants may be formed of the same dopants as the sensor well dopants. In other words, the Hall plate and the sensor well may have the same type of dopants (e.g., same polarity type and dopant concentration). Accordingly, the Hall plate may be lightly doped with first polarity type dopants for a first polarity type sensor, similar to the sensor well dopants. A lightly doped Hall plate may enable higher carrier mobility in the Hall plate 120 due to the low doping concentration. The low doping concentration and high carrier mobility in the Hall plate 120 enables high voltage sensitivity for the Hall sensor. In a non-limiting embodiment, the first polarity type dopants may be N-type dopants for an N-type Hall sensor. Providing an N-type Hall plate for the Hall effect sensor enables higher carrier mobility in the Hall plate 120, which facilitates high voltage sensitivity for the Hall sensor. In other words, the voltage sensitivity of the Hall sensor may be configured based on the dopant concentration of the Hall plate dopants and/or mobility of the carrier in the Hall plate. Providing the Hall plate 120 with other types of dopants, such as P-type dopants, or other dopant concentrations may also be useful.

The Hall plate may include first, second, third, and fourth Hall plate terminals or taps $130_1$, $130_2$, $130_3$ and $130_4$. In a non-limiting embodiment, the first, second, third, and fourth Hall plate terminals may be disposed at or near the ends of the Hall plate segments. The Hall plate terminals may be doped regions. In a non-limiting embodiment, the Hall plate terminals may be heavily doped with terminal dopants. The terminal dopants may be first polarity type dopants for a first polarity type sensor. For example, the terminal dopants and Hall plate dopants are the same polarity type dopants, in a non-limiting embodiment. Metal silicide contacts (not shown) may be disposed over the terminal regions to reduce contact resistance. For example, metal deposited on the terminal regions may react with silicon at terminal regions to form metal silicide.

In a non-limiting embodiment, the first and second Hall plate terminals $130_1$ and $130_2$ may be configured as a first current terminal and a second current terminal of the Hall effect sensor 110. The first current terminal and the second current terminal may be configured to flow a current through the Hall plate between the first current terminal and the second current terminal. The current may be configured to flow through the Hall plate in the length direction, in a non-limiting example. As for the third and fourth Hall plate terminals $130_3$ and $130_4$, they may be configured as a first sensing terminal and a second sensing terminal of the Hall effect sensor 110. The first sensing terminal and the second sensing terminal may be sensor terminals configured to sense a Hall voltage. For example, the Hall effect sensor measures a voltage differential or Hall voltage ($V_H$) between the third and fourth Hall plate terminals. The length L of the Hall plate may be visualized as the distance between the ends of opposing segments of the Hall plate, while the width w of the Hall plate may be the width of the segments in the length direction for a cross-shaped Hall plate, as illustrated in FIG. 1A. In a non-limiting embodiment, the first and second current terminals are disposed on opposing ends along a length direction of the cross, while the first and second sensing terminals are disposed on opposing ends along a width direction of the cross which is perpendicular to the length direction. The current and sensor terminals may be interchangeable or alternate with time. In other words, the current and sensor terminals may be swapped or switched. For example, the first and second Hall plate terminals $130_1$ and $130_2$ may be configured as sensor terminals, while the third and fourth Hall plate terminals $130_3$ and $130_4$ may be configured as current terminals. Other configurations for the terminals of the Hall effect sensor may also be useful.

A separation layer 160 and a separation well 165 may be disposed within the sensor well 115. In a non-limiting embodiment, the separation layer 160 and the separation well 165 may be doped with second polarity type dopants (or implants) for a first polarity type sensor. The separation layer 160 and the separation well 165 may have opposite polarity type dopants to the Hall plate. In a non-limiting example, the separation layer 160 and the separation well 165 may be intermediately doped with second polarity type dopants. In a non-limiting example, the separation layer 160 and the separation well 165 may be doped with P-type dopants for an N-type Hall sensor. In other cases, the separation layer 160 and the separation well 165 may be doped with N-type dopants for a P-type Hall sensor. The separation well 165 may include separation well terminals (not shown) coupled to a separation layer bias voltage for biasing the separation layer 160 through the separation well 165. In a non-limiting embodiment, the separation well terminals may be heavily doped with second polarity type dopants. For example, in the case the hall plate is N-type, the separation layer 160 and the separation well 165 are P-type, and the separation well terminals of the separation well 165 are heavily doped with P-type dopants.

In a non-limiting embodiment, the separation layer 160 and the separation well 165 may surround the Hall plate 120 and isolate or separate the Hall plate 120 from the sensor well 115, as illustrated in FIGS. 1A and 1B. The separation layer 160 and the separation well 165 may define the Hall plate 120 in the sensor well 115. In a non-limiting embodiment, a depth of the separation layer 160 from a top surface of the sensor well 115 may define an initial thickness of the Hall plate 120 in the sensor well, providing a predefined thickness of the Hall plate 120. For example, the initial thickness of the Hall plate 120 may be defined by adjusting a depth of the separation layer from a top surface of the sensor well. In other words, a predefined thickness of the Hall plate 120 may be configured by the dopant (or implant) of the separation layer. A thin Hall plate 120 may be achieved by implanting the separation layer 160 nearer to a top surface of the sensor well 115.

A sensor well terminal or tap 140 and a body well 150 may be disposed in the sensor well 115. The sensor well terminal 140 and the body well 150 may surround the Hall plate 120 as illustrated in FIG. 1A. In a non-limiting embodiment, the sensor well terminal 140 and the body well 150 may surround the separation well 165. The sensor well terminal 140 and the body well 150 may be doped regions. The sensor well terminal 140 and the body well 150 may be doped with first polarity type dopants for a first polarity type sensor. In a non-limiting embodiment, the sensor well terminal 140 may be a heavily doped region, while the body well 150 may be a intermediately doped region. For example, the sensor well terminal 140 may be heavily doped with the first polarity type dopants, while the body well 150 may be intermediately with the first polarity type dopants. The sensor well terminal 140 and the body well 150 may have the same polarity type dopants as the sensor well dopants. In a non-limiting example, the sensor well terminal 140 and the body well 150 may be doped with N-type dopants in the case the sensor well 115 is doped with N-type dopants. Providing the sensor well terminal 140 and the body well 150 with P-type dopants in the case the sensor well 115 is doped with P-type dopants may also be useful. The sensor well terminal 140 and the body well 150 may be coupled to a sensor well bias voltage for biasing the sensor well 115. Metal silicide contacts (not shown) may be disposed over the terminal regions to reduce contact resistance.

The current sensitivity (or current related Hall sensitivity) $S_i$ of a Hall effect sensor may be defined by Eqn 1 as follows:

$$S_i = \frac{V_{Hall}}{I_{bias} \cdot B}$$

where B is the magnetic field, and $I_{bias}$ is the input or supply current.

The voltage sensitivity (or voltage related Hall sensitivity) $S_v$ of a Hall effect sensor may be defined by Eqn 2 as follows:

$$S_v = \frac{V_{Hall}}{V_{bias}} = \frac{S_i}{R}$$

where $V_{bias}$ is the total biasing voltage, R is the resistance of the Hall effect sensor.

In a non-limiting embodiment, at least one of a current sensitivity and a resistance of the Hall effect sensor may be tunable based on an adjustable thickness of the Hall plate. In a non-limiting embodiment, the thickness of the Hall plate may be adjustable based at least in part on implants (i.e., dopants) in the separation layer 160 and/or a bias voltage applied to the separation layer (e.g., separation layer bias voltage applied via the separation well terminals). In a non-limiting embodiment, the thickness of the Hall plate may be further adjustable based at least in part on a bias voltage applied to the sensor well (e.g., sensor well bias voltages applied via the sensor well terminals). The separation layer 160 and/or the sensor well 115 may be employed to provide back bias to the Hall plate 120. The thickness of the Hall plate may be tunable by the implants in the separation layer 160 and/or back bias voltages applied to the separation layer 160 and/or the sensor well 115 through modulation of a depletion region between the Hall plate 120 and the separation layer 160. The bias voltages applied to the sensor well 115 and/or the separation layer 160 cause thickness of the depletion region to change. In other words, the thickness of the depletion region may be controlled to achieve the desired thickness for the Hall plate.

The thickness of the depletion region may be controlled by the magnitude and polarity of back bias voltages applied to the sensor well 115 and/or the separation layer 160. In other words, the sensor well and 115 and/or the separation layer 160 may be back biased with appropriate bias voltages to vary the thickness of the Hall plate to a thickness less than the predefined thickness. In a non-limiting example, in the case of a P-type separation layer and N-type Hall plate, a voltage −Ve may be applied to bias the separation layer to modulate the thickness of the depletion region. The sensor well 115 may be biased at a higher potential than the separation layer 160 to avoid forward bias of the P-N junction between the separation layer 160 and the sensor well 115. The magnitude of the bias voltages may determine the thickness of the depletion region to adjust the thickness of the Hall plate. In other words, the thickness of the Hall plate is adjustable by adjusting the separation layer bias voltage applied to the separation layer and/or adjusting the sensor well bias voltage applied to the sensor well to tune or modulate the current sensitivity $S_i$ of the Hall sensor, which is proportional to the resistance R. For example, modulating the Hall plate thickness to provide a thinner Hall plate results in a higher resistance R. Accordingly, with the same voltage sensitivity $S_v$ a thinner Hall plate will result in a higher current sensitivity $S_i$. In other cases, the separation layer may be coupled to ground. The device structure, as described, advantageously enables high voltage sensitivity and high current sensitivity to be achieved with dynamic sensing in the same device.

In some embodiments, the Hall effect sensor may include a second polarity type heavily doped region 180 in the sensor well. The second polarity type heavily doped region 180 may have depth less than the Hall plate. In a non-limiting embodiment, the second polarity type heavily doped region 180 may have a ring configuration. The second polarity type heavily doped region 180 may be arranged at least partially in the Hall plate in the case of a cross-shaped Hall plate, as illustrated in FIG. 1A. In other embodiments, the second polarity type doped region 180 may be provided with other types of dopant concentration other than a heavily doped region.

Isolation regions 190 may be disposed in the sensor well 115. In a non-limiting embodiment, the isolation regions may surround the Hall plate 120, the Hall plate terminals, the separation well 165 and/or the sensor well terminal/body well 140/150. The isolation region, as shown, extends from the top surface of the sensor well and into the sensor well. The depth should be sufficient to provide the desired isolation. The isolation regions 190 may be formed of a dielectric material such as silicon oxide, in a non-limiting example. Other configurations of the isolation regions may also be useful.

Figure 1C:
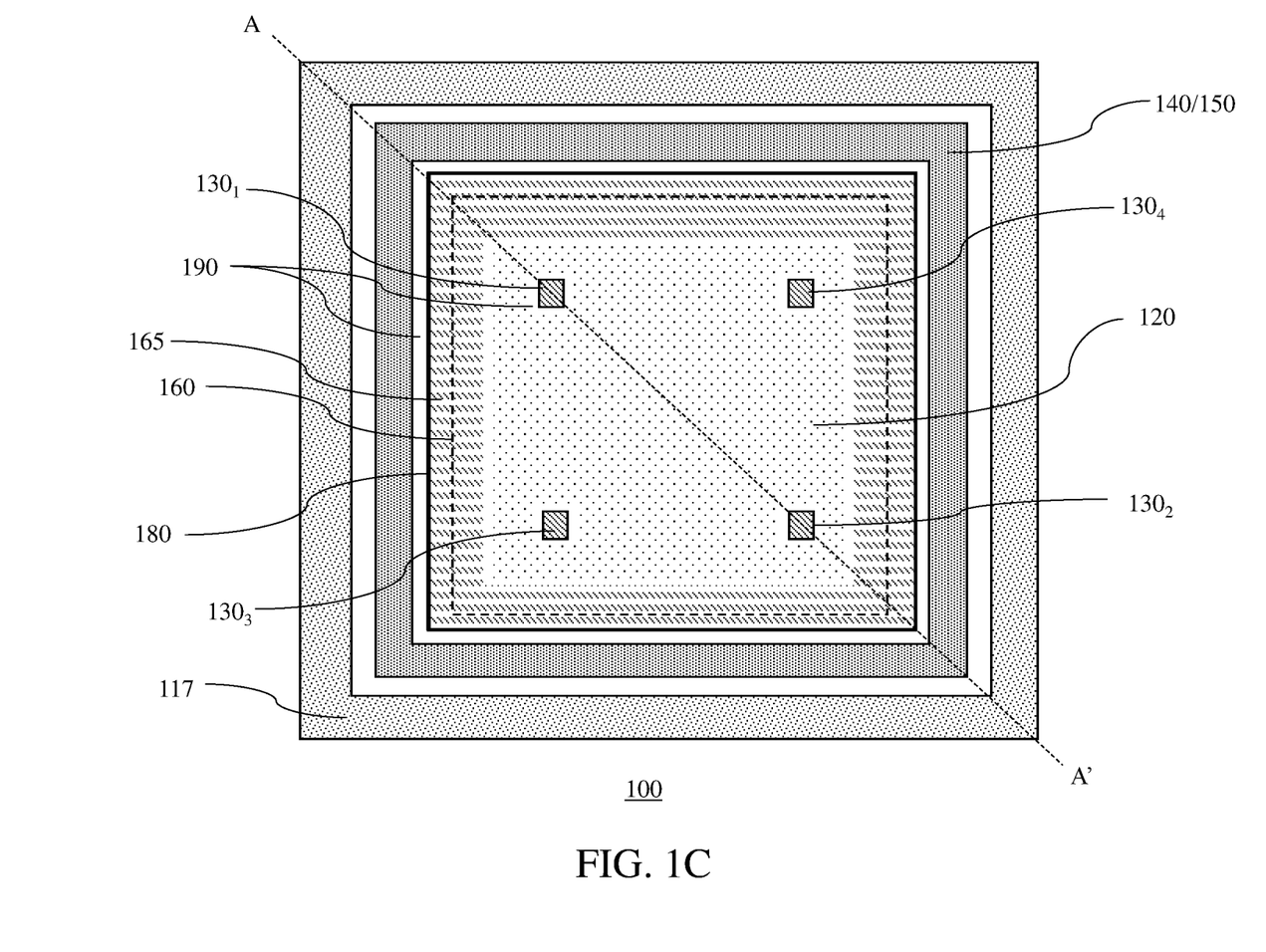
FIG. 1C shows a top view of another embodiment of the device.

FIG. 1C shows a top view of another embodiment of the device 100. The device 100 may include one or more Hall sensors. The cross-sectional view may be similar to that in FIG. 1C. Common elements may not be described or described in detail. As shown in FIG. 1C, the Hall plate 121 has a rectangular shape with Hall plate terminals $130_1$, $130_2$, $130_3$ and $130_4$ disposed at the corners of the Hall plate 120. The rectangular shape may be a square shape. The first and second Hall plate terminals are disposed at opposite corners while the third and fourth Hall plate terminals are disposed at the other opposite corners. The Hall plate terminals $130_1$, $130_2$, $130_3$ and $130_4$ may be first and second current terminals and first and second sensing terminals. In a non-limiting example, the first and second current terminals are disposed on a first set of diagonal corners, while the first and second sensing terminals are disposed on a second set of diagonal corners of the rectangular shaped Hall plate. The second polarity type heavily doped region 180 may be arranged to surround the Hall plate 120 and the separation well 165. It is understood that other Hall plate shapes may also be useful.

Figure 2A:
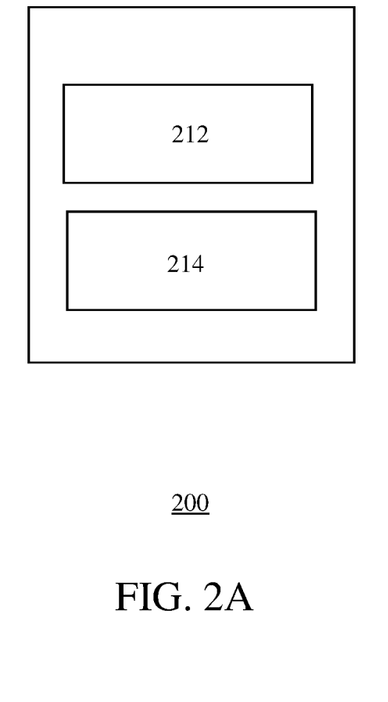
FIGS. 2A-2B show block diagrams of various embodiments of a Hall device.
Figure 2B:
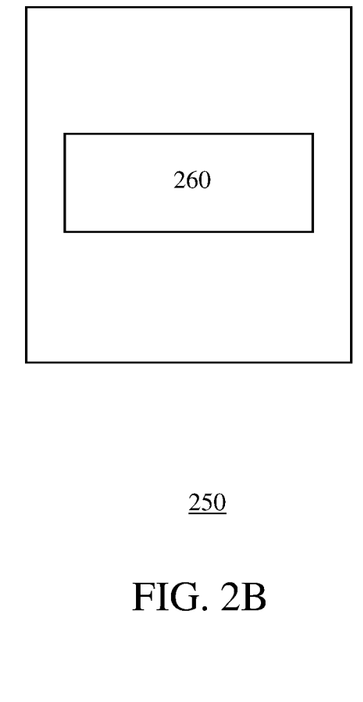

FIGS. 2A-2B show block diagrams of various embodiments of a Hall device having one or more Hall sensors similar to that described in FIGS. 1A-1C. The Hall device allows for low power sensing for initial detection and switching to higher sensitivity by adjusting the biasing voltages. The Hall sensors may be useful in internet-of-things (IoT) devices, in a non-limiting example. Referring to FIG. 2A, a Hall device 200 may include a first Hall sensor 212 and a second Hall sensor 214 (e.g., two sensors) on a chip, each operating at different bias voltages. The two sensors may have different types of sensing. In a non-limiting embodiment, the first Hall sensor 212 and the second Hall sensor 214 may have the same implants and/or depth for the respective separation layers (e.g., formed from the same process) but different back biasing voltages applied to the respective separation layers and the sensor wells. For example, the first Hall sensor 212 may be configured with low sensitivity and power, while the second Hall sensor 214 may be configured with high sensitivity and power. Differential sensing may be achieved between the first and second Hall sensors. A differential Hall voltage between the two Hall sensors increases with the magnetic field. In other embodiments, the first Hall sensor 212 and the second Hall sensor 214 may have different implants and/or depth for the respective separation layers. Referring to FIG. 2B, a Hall device 250 includes a single dynamic sensor 260 with dynamic sensing on a chip for power aware and sensitivity optimization. The dynamic sensor may be tuned by the back biasing voltages applied to the separation layer and the sensor well. Differential sensing may be achieved by dynamic biasing of the sensor 260. The Hall devices 200 and 250 may be applicable to fully depleted SOI or SOI with variable back bias.

Figure 3:
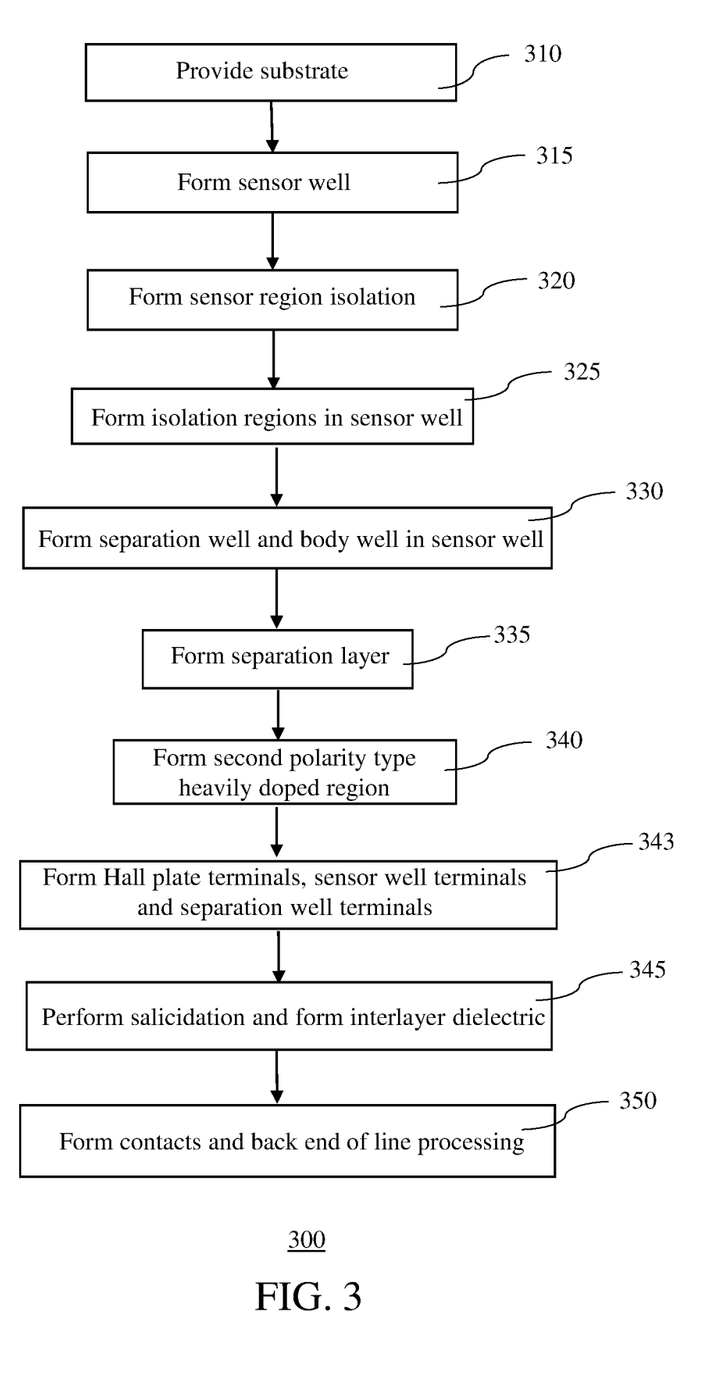
FIG. 3 shows a block diagram of an exemplary process for forming a device.

FIG. 3 shows a block diagram of an exemplary process 300 for forming a device. The device, for example, is similar to that described in FIGS. 1A-1C. At 310, a substrate may be provided. In a non-limiting embodiment, the substrate may be a bulk substrate. The substrate may be a semiconductor substrate, such as a silicon substrate in a non-limiting embodiment. For example, the substrate may be a lightly doped p-type substrate in a non-limiting embodiment. Providing an intrinsic or other types of doped substrates, such as SiGe, Ge, GaAs or any other suitable semiconductor materials, may also be useful. In some embodiments, the substrate may be a COI substrate. Other types of substrates may also be useful. The substrate may include a sensor region over the substrate. One or more Hall effect sensors may be formed in the sensor region.

At 315, a sensor well may be arranged over the substrate. The sensor well may be formed by growing an epitaxial layer over the substrate, in a non-limiting embodiment. In another non-limiting embodiment, a deep doped well may be formed in the substrate to form the sensor well. The sensor well may be doped with sensor well dopants. In a non-limiting embodiment, the sensor well dopants may be first polarity type dopants for a first polarity type sensor. For example, sensor well dopants are implanted into the substrate or in the epitaxial layer using an implant mask with an opening corresponding to the sensor well region in the substrate. The energy of the implant is sufficient to form the sensor well in the substrate. The sensor well may be lightly doped with sensor well dopants. The implant mask is removed after forming the sensor well.

At 320, sensor region isolation may be formed. The sensor region isolation may be formed to surround the sensor region. In a non-limiting embodiment, the sensor region isolation may be arranged to surround the sensor well. The sensor region isolation region may be formed by implanting dopants into the sensor well. In a non-limiting embodiment, the sensor isolation region may be formed by lightly doping second polarity type dopants into the sensor well. For example, the dopants are implanted into the substrate using an implant mask with an opening corresponding to the sensor region isolation. The implant mask is removed after forming the sensor region isolation. The sensor region isolation may have a same depth as the sensor well. Other configurations of the sensor region isolation may also be useful.

At 325, isolation regions may be formed in the sensor well. In a non-limiting embodiment, the isolation regions may be formed to surround a subsequently formed Hall plate, Hall plate terminals, separation well and/or sensor well terminal/body well. The isolation regions may be shallow trench isolation (STI) regions. For example, the substrate may be etched using mask and etch techniques to form isolation trenches which is then filled with dielectric materials, such as silicon oxide. Chemical mechanical polishing (CMP) may be performed to remove excess oxide and provide a planar substrate top surface. Other processes or materials can also be used to form the isolation regions.

At 330, a separation well for biasing a subsequently formed separation layer and a body well for biasing the sensor well may be formed in the sensor well. The separation well may be arranged to define a shape of the Hall plate. The separation well and the body well may include different polarity type dopants formed using separate implant processes. For example, an implant mask is formed over the sensor well with an opening corresponding to the separation well. Second polarity type dopants may be implanted into the sensor well to form the separation well. The implant mask is removed after forming the separation well. Similarly, an implant mask is formed over the sensor well with an opening corresponding to the body well. First polarity type dopants may be implanted into the sensor well to form the body well. The sensor well may be intermediately doped with the first polarity type dopants to form the body well. The implant mask is removed after forming the body well.

At 335, a separation layer may be formed within the sensor well. For example, an implant mask is formed over the sensor well with an opening corresponding to the separation layer. Second polarity type dopants may be implanted into the sensor well to form the separation layer. The sensor well may be intermediately doped with the second polarity type dopants to form the separation layer. The dose and energy of the implant is sufficient to form the separation layer in the sensor well. The depth of the implant for the separation layer may depend on the desired initial thickness of the Hall plate. For example, the initial thickness of the Hall plate may be defined by adjusting a depth of the separation layer from a top surface of the sensor well. The energy of the implant employed for the separation layer may depend on the desired thickness of Hall plate, while the dose of the implant employed for the separation layer depends on the background doping (i.e., doping of the Hall plate/sensor well). The implant mask is removed after forming the separation layer.

The separation layer and the separation well may define (or form) the Hall plate in the sensor well. In a non-limiting embodiment, the Hall plate may be formed of the same material and dopants as the sensor well. For example, in the case the sensor well is formed of an epitaxial layer grown over the substrate, the Hall plate may be formed of the same epitaxial layer. In the case the sensor well is a deep doped well in the substrate, similarly, the Hall plate may be formed from the deep doped well in the substrate (i.e., part of the deep doped well). The Hall plate may have dopants of the same polarity type and concentration as the sensor well dopants in a non-limiting embodiment. Other configurations of the Hall plate dopants may also be useful.

At 340, a second polarity type heavily doped region may be formed in the sensor well. The second polarity type doped region may have a depth less than the Hall plate. For example, second polarity type dopants are implanted into the sensor well using an implant mask with an opening corresponding to the second polarity type heavily doped region in the sensor well. In other embodiments, the second polarity type doped region may be formed with other dopant concentrations. In a non-limiting embodiment, the second polarity type heavily doped region may have a ring configuration. In a non-limiting embodiment, the second polarity type heavily doped region may be formed at least partially in the Hall plate in the case of a cross-shaped Hall plate. In another non-limiting embodiment, the second polarity type heavily doped region may be formed to surround the Hall plate in the case of a rectangular-shaped Hall plate. The implant mask is removed after forming the second polarity type heavily doped region.

At 343, Hall plate terminals, sensor well terminals and separation well terminals may be formed in the sensor well. For example, heavily doped regions of a first polarity type are formed in the sensor well. The first polarity type dopants may be implanted into the sensor well using an implant mask to form the Hall plate terminals and sensor well terminals. The implant mask may be removed after forming the Hall plate terminals and sensor well terminals. The Hall plate terminals may be current terminals and sensing terminals, which are formed in the Hall plate. For example, the Hall plate may include a first current terminal and a second current terminal configured to flow a current through the Hall plate between the first current terminal and the second current terminal, and a first sensing terminal and a second sensing terminal configured to sense a Hall voltage. Heavily doped regions of a second polarity type are formed in the sensor well for the separation well terminals. For example, second polarity type dopants may be implanted into the sensor well using an implant mask to form the separation well terminals. The implant mask may be removed after forming the separation well terminals.

At 345, salicidation may be performed and an interlayer dielectric (ILD) may be formed over the substrate. Silicide contacts may be formed over the terminal regions to reduce contact resistance. To form silicide contacts, a metal layer is formed over the substrate and annealed to cause a reaction with the exposed substrate or epitaxial layer. The unreacted metal may be removed by a wet etch, leaving silicide contacts over the terminal regions. The process continues to form one or more ILD layers over the substrate. CMP may be performed to provide a planer surface.

At 350, contacts are formed in the one or more ILD layers. In a non-limiting example, the contacts may be tungsten contacts formed by a damascene process. For example, via openings are formed in the one or more ILD layers and filled with contact material. Excess contact material may be removed by CMP. The process continues with back-end-of-line (BEOL) processing of the device, such as other metallization layers, passivation, etc. The sensor well terminal may be coupled to a sensor well bias voltage for biasing the sensor well, while the separation well terminals may be coupled to a separation layer bias voltage for biasing the separation layer.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:
1. A device comprising:
a substrate having a sensor region over the substrate;
a Hall effect sensor disposed in the sensor region, the Hall effect sensor comprises
 a sensor well;
 a Hall plate disposed within the sensor well, wherein the Hall plate comprises a first current terminal and a second current terminal configured to flow a current through the Hall plate between the first current terminal and the second current terminal, and wherein the Hall plate further comprises a first sensing terminal and a second sensing terminal configured to sense a Hall voltage,
 a separation layer disposed within the sensor well below the Hall plate;
 a separation well disposed within the sensor well, wherein the separation well surrounds and at least partially in direct contact with sides of the Hall plate, wherein the separation layer and the separation well isolate the Hall plate from the sensor well, and wherein the separation well comprises separation well terminals coupled to a separation layer bias voltage for biasing the separation layer, a body well disposed within the sensor well, wherein the body well surrounds the separation well and at least partially in direct contact with the separation well wherein the body well comprises sensor well terminals coupled to a sensor well bias voltage for biasing the sensor well, wherein the body well comprises a dopant concentration different from the sensor well and different from the sensor well terminals, and wherein at least one of a current sensitivity and a resistance of the Hall effect sensor is tunable based on an adjustable thickness of the Hall plate;

wherein the thickness of the Hall plate is adjustable based at least in part on implants in the separation layer, a sensor well bias voltage applied to the sensor well, a separation layer bias voltage applied to the separation layer, or combinations thereof.

2. The device of claim 1, wherein the sensor well is an epitaxial layer disposed over the substrate.

3. The device of claim 1, wherein the sensor well is a deep doped well disposed in the substrate.

4. The device of claim 1, wherein a voltage sensitivity of the Hall effect sensor is based on dopant concentration of Hall plate dopants in the Hall plate.

5. The device of claim 4, wherein the sensor well has a dopant concentration, and wherein the Hall plate has a dopant concentration that is the same as the dopant concentration of the sensor well.

6. The device of claim 5, wherein the Hall plate and the separation layer comprise different polarity type dopants.

7. The device of claim 1, wherein a predefined thickness of the Hall plate is based on a depth of the separation layer from a top surface of the sensor well.

8. The device of claim 1, wherein the Hall effect sensor is a first Hall effect sensor in the sensor region, wherein the device further comprises a second Hall effect sensor disposed in the sensor region, wherein the second Hall effect sensor is configured to have a different sensitivity from the first Hall effect sensor.

9. The device of claim 1, wherein the Hall plate comprises a cross shape, wherein the first and second current terminals are disposed on opposing ends along a length direction of the cross; and the first and second sensing terminals are disposed on opposing ends along a width direction of the cross which is perpendicular to the length direction.

10. The device of claim 1, wherein the Hall plate comprises a rectangular shape, wherein the first and second current terminals are disposed on a first set of diagonal corners, while the first and second sensing terminals are disposed on a second set of diagonal corners of the rectangular shaped Hall plate.

11. The device of claim 1, wherein the Hall plate comprises N-type dopants, while the separation layer and the separation well comprise P-type dopants.

12. The device of claim 1, wherein the Hall plate is lightly doped with dopants while the separation layer is intermediately doped with dopants.

13. The device of claim 1, further comprising a sensor region isolation, the sensor region isolation surrounds the sensor region and isolates the sensor region.

14. The device of claim 13, wherein the sensor region isolation surrounds the sensor well and isolates the sensor well of the Hall effect sensor from one or more adjacent sensor wells.

15. The device of claim 1, wherein the separation well partially abuts the sensor well.

16. The device of claim 1, wherein the Hall plate is lightly doped with first polarity type dopants, the separation well is intermediately doped with second polarity dopants, and the separation well terminals are heavily doped with second polarity type dopants.

17. The device of claim 1, further comprising isolation regions disposed in the sensor well, wherein the isolation regions comprise dielectric material, and wherein the isolation regions are arranged between the separation well and the Hall plate and/or between the body well and the separation well.

18. The device of claim 1, wherein the body well at least partially contacts sides of the separation well.

19. The device of claim 18, wherein a voltage sensitivity of the Hall effect sensor is based on dopant concentration of Hall plate dopants in the Hall plate.

20. The device of claim 19, wherein the sensor well has a dopant concentration, and wherein the Hall plate has a dopant concentration that is the same as the dopant concentration of the sensor well.

* * * * *